HIGH VOLTAGE SEMICONDUCTOR TRANSISTOR

Filed June 27, 1966

INVENTORS
ADOLPH BLICHER &
BOHDAN R. CZORNY

BY G. H. Bruestle
Attorney

United States Patent Office 3,427,515
Patented Feb. 11, 1969

3,427,515
HIGH VOLTAGE SEMICONDUCTOR TRANSISTOR

Adolph Blicher, North Plainfield, and Bohdan R. Czorny, Bound Brook, N.J., assignors to Radio Corporation of America, a corporation of Delaware Filed June 27, 1966, Ser. No. 560,521
U.S. Cl. 317—235 5 Claims
Int. Cl. H01l *11/00, 15/00*

ABSTRACT OF THE DISCLOSURE

A transistor for providing high reverse voltage capability has relatively high resistivity subregions forming the collector PN-junction between them. One of the subregions is a part of the base region and the other a part of the collector region.

Figure 1:
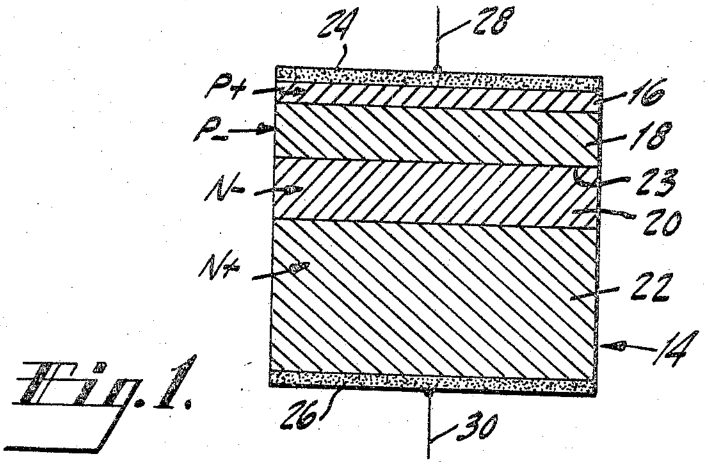

This invention relates to improved semiconductor devices and, more particularly, to semiconductor devices having increased voltage breakdown characteristics and increased current carrying capabilites.

A high voltage breakdown characteristic of the PN junction of a number of semiconductor devices, such as transistors or diodes used in horizontal deflection and high voltage rectifier circuits, is needed. An improved current carrying capability of these semiconductor devices, resulting in higher current gains, lower voltage drops and smaller power dissipation is of great importance as well.

High voltage transistors now available usually have a collector region consisting of at least one high resistivity region. In the case of an NPN transistor, this region consists of high resistivity N type semiconductor. The base region of these devices is usually diffused, and in the case of an NPN transistor, it is diffused with a P type impurity such as boron or gallium. Since the impurity concentration of the collector region is normally very low to achieve a high breakdown voltage and the diffusion of the base is comparatively shallow to achieve reasonable diffusion times, the PN collector junction is almost an abrupt junction with the P region having much higher impurity concentration than the N region. The electric field which appears at this type of a junction when a reverse voltage is applied is high, and, as a consequence, the PN junction breaks down readily.

Therefore, an object of the present invention is to provide improved semiconductor devices capable of withstanding high reverse voltages.

A further object of this invention is to provide improved semiconductor devices having high collector reverse voltage and current carrying capabilities.

The above objects are achieved in either transistors or diodes by forming high resistivity sub-regions on both sides of a PN junction of the device, thus reducing the maximum field in the depletion region under conditions of reverse bias. The ideal situation for increasing the reverse voltage capability of the junction is created when concentrations of donor and acceptor impurities are approximately equal on both equally thick sides of the PN junction. Under this ideal situation, the applied junction voltage can be doubled and the maximum electric field will remain the same.

Figure 2:
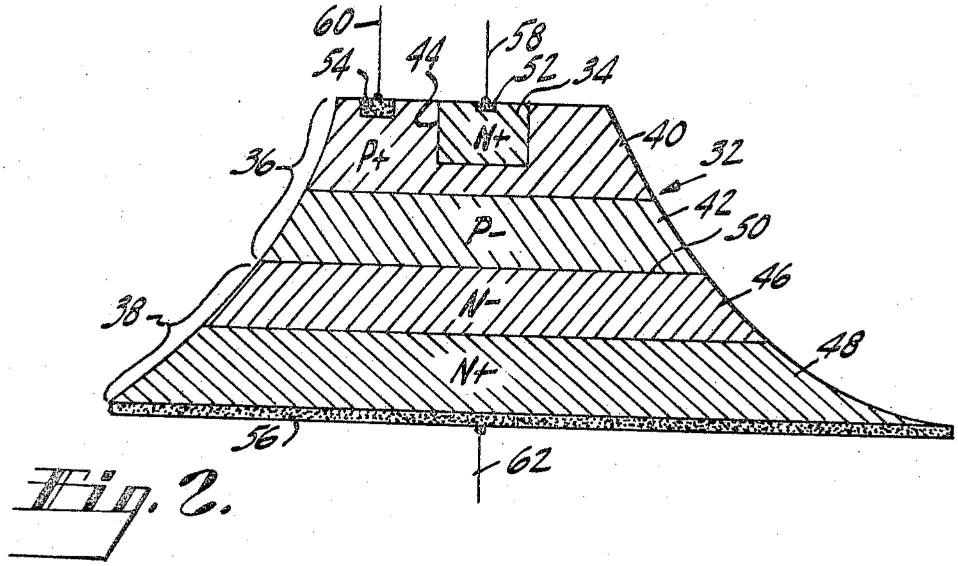

In the drawings:

FIGURE 1 is a section of a PN junction diode embodying the present invention; and FIGURE 2 is a section of an NPN transistor embodying the present invention;

FIGURE 1 shows a silicon PN junction diode 14 in which the P region of the diode comprises two subregions 16 and 18. The sub-region 18 has a lower impurity concentration and hence a higher resistivity than the sub-region 16. The sub-regions 16 and 18 are therefore identified, respectively, as P+ and P—. The N region of the diode 14 comprises two sub-regions 20 and 22. The sub-region 20 has a lower impurity concentration and hence higher resistivity than the sub-region 22. The sub-regions 20 and 22 are therefore identified as N— and N+, respectively. The P— and N— sub-regions 18 and 20, respectively, are in direct contact with one another and thus form a PN junction 23. In addition, the P— and N— sub-regions 18 and 20 are symmetrical in that they have approximately equal concentrations of acceptor and donor impurities, respectively, and are of approximately equal thicknesses.

It has been found, that either the acceptor or donor impurity concentration can be three times the concentration of the other and still provide an improvement in the reverse voltage capability of the semiconductor device. Therefore, as used herein, the term "approximately equal concentrations" is understood to mean a variation from being exactly equal to one concentration being three times the other.

Contacts 24 and 26 are connected to the P+ sub-region 16 and the N+ sub-region 22, respectively, for attaching leads 28 and 30 to the device 14. The contacts 24 and 26 may be dipped lead contacts. Alternatively, other well-known contact materials and methods, such as ultrasonicaly bonding, can be employed.

For purposes of clearly describing this invention, the junction 23 of the diode 14 will be referred to as a P–N-junction. This P–N-junction serves to increase the junction's reverse breakdown voltage. This result is achieved by forming the high resistivity P— and N— sub-regions 18 and 20 on both sides of the junction 23, and thus reducing the maximum field in the depletion region under reverse bias. The ideal case is that in which the concentrations of acceptor and donor impurities respectively are approximately equal on both equally thick sides of the P–N-junction 23. This ideal case is known as a symmetrical junction.

The maximum electrical field in an abrupt PN junction of either a semiconductor diode or transistor is represented by the following general expression:

$$E_{\max}=\left[\frac{2q}{k\epsilon_o}(V_o-V)\left[\frac{N_aN_d}{N_a+N_d}\right]\right]^{1/2}$$

where $q$=electron charge=$1.60\times10^{-19}$ coulomb $k$=dielectric constant of the semiconductor $\epsilon_o$=permittivity of free space=$8.85\times10^{-12}$ coulomb$^2$/Newton-meter$^2$ $N_a$=net acceptor density in the P region, in number of ionized impurities per cubic meter $N_d$=net donor density in the N region, in number of ionized impurities per cubic meter $V_o$=contact potential, in volts, and $V$=applied reverse voltage, in volts.

For a highly non-symmetrical junction with $N_a$ very large compared to $N_d$, and neglecting $V_o$, the maximum field is $$E_1\ \max.=\left[\frac{2q}{k\epsilon_o}VN_d\right]^{1/2}$$

On the other hand, for a symmetrical junction where $N_d=N_a$ the maximum field is $$E_2\ \max.=\left[\frac{2q}{k\epsilon_o}\frac{VN_d}{2}\right]^{1/2}$$

Assuming $N_d$ to be the same in either case, it can be shown that in the symmetrical case (i.e., $N_a=N_d$) the voltage V can be doubled as compared to the non-symmetrical case and the resulting maximum field will remain the same.

From the above considerations, it is possible to increase the reverse voltage capability of the P–N-junction 23 as long as the impurity concentrations on each side of the junction 23 are about the same up to a factor of about 3, since even in the cases where $N_d=3N_a$ or $N_a=3N_d$ there is a significant lowering of the field for the same applied voltage. For the case of complete symmetry, i.e., for $N_a=N_d$ and the same thickness of the P— and N— regions 18 and 20, the voltage applicable to the junction 23 can be increased by a function of two as compared to the situation where $N_a$ and $N_d$ differ widely.

FIG. 2 illustrates an NPN silicon transistor 32 having improved current-carrying capability. The transistor 32 comprises an emitter region 34, a base region 36, and a collector region 38. The base region 36 includes a first sub-region 40 and a second sub-region 42. The first base sub-region 40 is adjacent the emitter 34 and forms therewith an emitter PN junction 44. The second base sub-region 42 has a lower impurity concentration and hence higher resistivity than does the first base sub-region 40; these sub-regions are accordingly identified as P+ and P—, respectively. The collector region 38 includes a first sub-region 46 and a second sub-region 48. The first collector sub-region 46 is adjacent the base region 36 and forms therewith a collector PN junction 50. The first collector sub-region 46 has a lower impurity concentration and hence higher resistivity than the second collector sub-region 48; these sub-regions are accordingly identified as N— and N+, respectively.

Metallic contacts 52, 54, and 56 are applied, respectively, to the emitter, base, and collector regions 34, 36, and 38. Terminal wires 58, 60, and 62 are connected, respectively, to the emitter, base, and collector contacts 52, 54, and 56.

When the transistor is used, for example, as an amplifier, the emitter 34 is forward biased and the collector 38 is reverse biased. If the number of current carriers (electrons in the case considered) traversing the transistor regions is comparable to the number of impurities (fixed charges) in the second base sub-region 42 and/or the first collector sub-region 46, the so-called base-widening effect will take place. This arises from the fact that the carrier velocity in the collector depletion region is finite and reaches a limit of about $9\times10^6$ cm. per sec. for electrons at fields higher than 3000–4000 volts per cm. As a consequence, there exists a non-zero concentration of minority carriers in the collector-base depletion region. The charge of the carriers adds up algebraically to the existing fixed charges in both sides of the depletion region. The charge of a minority carrier is always of the same sign as that of the ionized impurities in the base region. This is equivalent to an increased concentration in the base so that one part of the collector-base depletion region which is in the base becomes narrower, and the second part residing in the high resistivity collector body becomes wider. As a result, the entire depletion region shifts toward the collector contact 56 as the current is increased but the applied reverse voltage is kept the same. As a result, the base width of the transistor is increased. The displacement of the depletion region is particularly large when the concentration of charges of the current flow is comparable to the doping level of the first sub-region 46 of the collector 38. Since the symmetrical P–N-collector junction 50 exhibits 50% lower electric field for the same applied reverse potential as compared to an asymmetrical junction with the same doping level $N_d$, then it is possible to use a lower resistivity sub-region 46 without the risk of reaching that electric field magnitude at which avalanche breakdown occurs.

Using the equations above and keeping the voltage constant, the following expression is obtained:

$$\frac{E_2\ \text{max.}}{E_1\ \text{max.}}=\left[\frac{N_{2d}}{2N_{1d}}\right]^{1/2}$$

It was assumed that the donor concentrations $N_d$ are not the same in the symmetrical and asymmetrical cases. For $N_{2d}=2N_{1d}$, it can be seen that $E_2$ max$=E_1$ max, that is the concentration of the N— region 46 can be doubled as compared to the asymmetrical case without affecting the maximum field and thus make the base widening effect less marked.

The possibility of minimization of the base widening effect is of primary importance because both the current gain of a transistor and its frequency cut-off is inversely proportional to the square of the base width. Higher impurity concentration in the N— collector sub-region 46 will lead to higher current gains at high current densities, since the base widening effect will be less pronounced.

There are several methods of making semiconductor devices. One common method of forming a PN junction within a semiconductor body is the alloying or fusion technique. A second common method for the formation of junctions is known as the diffusion technique. However, both the alloying and diffusion techniques have the limitation that the concentration of active impurity atoms and the position thereof within the semiconductor body are not variable at will. In a diffused junction, the active impurity atoms must follow a physical distribution curve which is not easily controlled. In addition, a shallow gradient diffused impurity distribution, which provides an approximation of the concept of this invention, requires undesirably long diffusion times and/or diffusant source concentrations below the state of the art of diffusion technology. On the other hand, alloying produces an alloyed or regrown region which will contain an impurity concentration at the maximum solubility limit of that particular impurity in the semiconductor.

Therefore, in view of the above limitations of known alloying and diffusion techniques, a third method of forming a junction within a semiconductor body, namely the well-known epitaxial growth technique, is preferably employed to construct devices embodying the invention. The epitaxial method allows for a very close control of the impurity concentrations of each region on the PN junction and allows any arbitrary predetermined distribution of impurities within the semiconductor. However, it is not necessary to provide all regions of the transistor 32 by epitaxial techniques. Methods employed for producing the transistor 32 may include diffusing the P+ base sub-region 40 and the N+ emitter region 34 into the P— base sub-region 42. The epitaxial method may be used only for growing the N- and the P-collector and base sub-regions 46 and 42, respectively, on the N+ semiconductor substrate 48.

A symmetrical P–U-junction 23 of the type shown in FIGURE 1, has been constructed. The N+ sub-region 22 was a 7.0 mil substrate having a resistivity of .01 ohm-cm. The N— sub-region 20 was approximately 1.5 mils thick having a high resistivity of 15 ohm-cm. while the P— sub-region 18 was approximately 1.5 mils thick having a high resistivity of approximately 35 ohms-cm. Finally, the P+ sub-region 16 was 0.25 mil thick, having a resistivity of 0.02 ohm-cm.

Considering one example of the transistor 32 of FIGURE 2 in terms of the impurity concentration rather than the resistivity, the P+ base sub-region 40 may have a doping level of $10^{19}$ atoms per cm.$^3$; the P— base sub-region 42 and the N— collector sub-region 46 each may have a doping level of $3\times10^{14}$ atoms per cm.$^3$. In this particular example, mesa diodes may be etched to evaluate the P–N-junction 50. Reverse breakdown voltages of 900 to 1000 volts are produced with very low reverse leakages. Calculations show that the maximum theoretical breakdown of the high resistivity sub-region 46 of the collector alone for a highly non-symmetrical junction is approximately 700 volts, therefore indicating the great benefit of the high resistivity sub-region of the base.

The P–N-junctions of the improved devices have very useful applications in high voltage, high current applications. For example, transistors employing the present invention are useful for such applications as television deflection and auto ignition. In both of these applications it is desirable to have a high voltage capability to withstand the turn-off voltage surge which is experienced in a television deflection transistor or an auto ignition transistor.

For a desired collector breakdown voltage in a transistor, both the thickness and the resistivity of the collector can be reduced when practicing this invention since some of the voltage is supported in the high resistivity sub-region of the base. This results in considerable improvement in the high current handling capability of the transistor.

Of course, the P–N-junction of the present invention embodied in the NPN transistor 32 could also be employed in a PNP transistor. Such a configuration would include a P+ emitter region 34, a base region 36 made up of an N+ sub-region 40 and an N− sub-region 42, and a collector region 38 made up of a P− sub-region 46 and a P+ sub-region 48.

In addition, the invention can equally apply to semiconductor materials other than silicon, e.g., germanium and gallium arsenide.

What is claimed is:

1. In a transistor having emitter, base, and collector electrodes, a first region of a first type conductivity semiconductive material, a second region of a second type conductivity semiconductive material opposite to that of said first type, said second region having a sub-region of higher resistivity than the remainder of said second region, and a third region of said first type conductivity semiconductive material, said third region having a sub-region of higher resistivity than the remainder of said third region, said high resistivity sub-regions forming a PN junction and having relative levels of impurity concentration within a ratio of about three to one, to increase the reverse breakdown voltage of said transistor.

2. A transistor as in claim 1 wherein at least said high resistivity sub-regions are epitaxial layers.

3. A transistor as in claim 1 wherein said sub-regions are symmetrical.

4. A transistor structure comprising:

an emitter region of a first type conductivity semiconductive material, a base region of a second type conductive semiconductive material opposite to said first type, said base region including a sub-region of lower impurity concentration and higher resistivity than the remainder of said base region, and a collector region of said first type conductivity semiconductive material, said collector region including a sub-region having an impurity concentration and resistivity approximately the same as that of said base sub-region, said base sub-region forming together with said collector sub-region a PN junction having an increased reverse breakdown voltage.

5. A transistor structure comprising:

an emitter region of a first type conductivity semiconductive material, a base region of a second type conductivity semiconductive material opposite that of said first type, said base region comprising first and second sub-regions, said first base sub-region being situated between said emitter region and said second base sub-region, said second base sub-region having a lower impurity concentration and higher resistivity than said first base sub-region, and a collector region of said first type conductivity semiconductive material, said collector region comprising first and second sub-regions, said first collector sub-region situated between said base region and said second collector sub-region, said first collector sub-region having a lower impurity concentration and higher resistivity than said second collector sub-region, said first collector sub-region being of higher impurity concentration and lower resistivity than said second base sub-region, thereby increasing the current carrying capabilities of the transistor.

References Cited

UNITED STATES PATENTS

| | | | |
|---|---|---|---|
| 3,067,485 | 12/1962 | Ciccolella et al. | 29—25.3 |
| 3,254,275 | 5/1966 | Lob | 317—234 |
| 3,286,137 | 11/1966 | Luescher et al. | 317—234 |

JAMES D. KALLAM, *Primary Examiner.*

U.S. Cl. X.R.

317—234; 29—569; 148—33